United States Patent [19]

Katayama et al.

[11] Patent Number: 4,940,931
[45] Date of Patent: Jul. 10, 1990

[54] DIGITAL WAVEFORM MEASURING APPARATUS HAVING A SHADING-TONE DISPLAY FUNCTION

[75] Inventors: Aiichi Katayama, Isehara; Kenichi Kon, Machida, both of Japan

[73] Assignee: Anritsu Corporation, Tokyo, Japan

[21] Appl. No.: 368,868

[22] Filed: Jun. 20, 1989

[30] Foreign Application Priority Data

Jun. 24, 1988 [JP] Japan .................................. 63-157629
Jan. 10, 1989 [JP] Japan ...................................... 1-2131

[51] Int. Cl.$^5$ ...................... G01R 13/20; G01R 13/26
[52] U.S. Cl. .................................. 324/121 R; 340/793; 364/487
[58] Field of Search ............................... 340/793, 767; 324/121 R; 364/521, 487

[56] References Cited

U.S. PATENT DOCUMENTS

| 3,838,209 | 9/1974 | Isuchiya et al. ...................... 340/793 |
| 4,361,850 | 11/1982 | Nishimura ............................ 340/793 |
| 4,559,535 | 12/1985 | Watkins et al. ....................... 340/793 |

FOREIGN PATENT DOCUMENTS 62-223681 10/1987 Japan .
1-9985 3/1989 Japan .
1-17116 3/1989 Japan .

OTHER PUBLICATIONS

Electronic Design–Oct. 18, 1984, pp. 165–178, F. D. Rampey, Art Porter and Mike Karin (Hewlett-Packard Co.).

Primary Examiner—Reinhard J. Eisenzopf
Assistant Examiner—W. Burns
Attorney, Agent, or Firm—Frishauf, Holtz, Goodman & Woodward

[57] ABSTRACT

A timing signal generating circuit generates a timing signal for each sweep timing period. An address generating circuit generates an address corresponding to each sweep timing period and to the magnitude of the input signal, each time it receives the timing signal. An image memory stores data in the address generated by the address generating circuit. A computing unit performs, upon each receipt of the timing signal, a predetermined computation on that data stored in the image memory and generates a result of computation. The computation result represents the frequency of the same address generated for each sweep timing period. A display unit displays the input signal with a luminance level corresponding to the computation result.

29 Claims, 14 Drawing Sheets

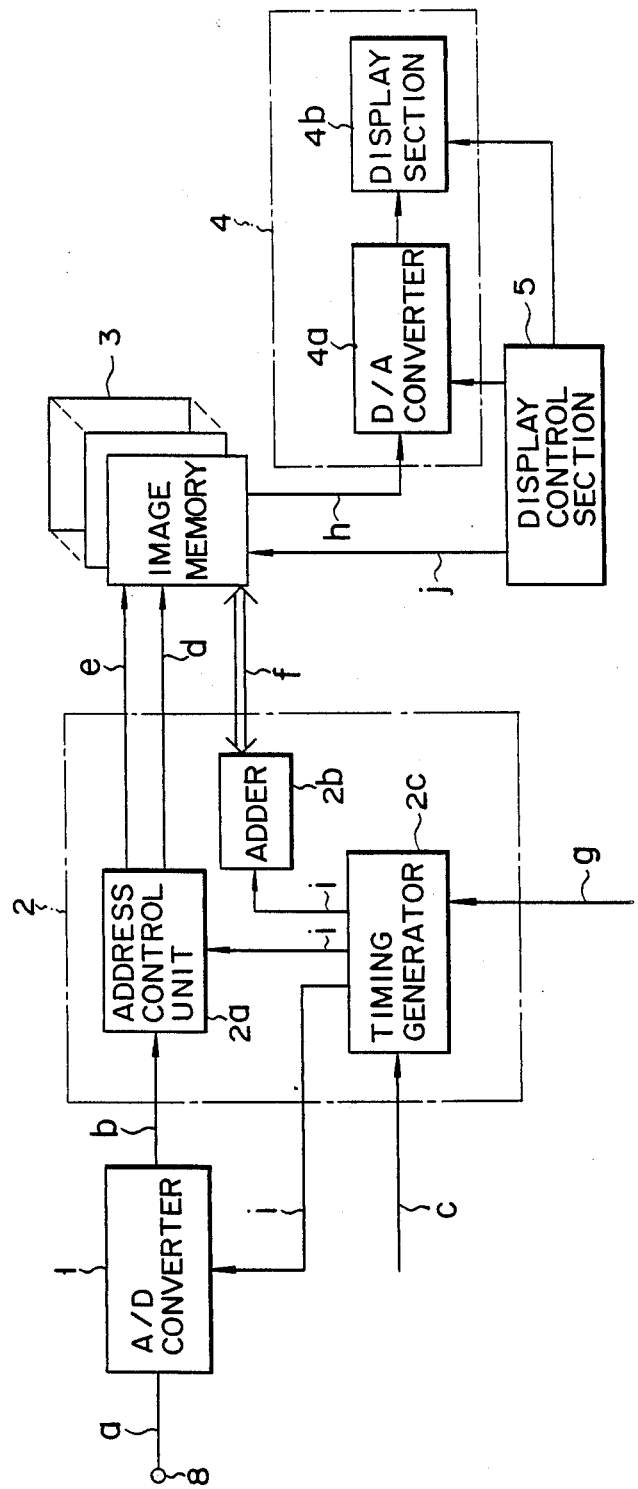
F I G. 1

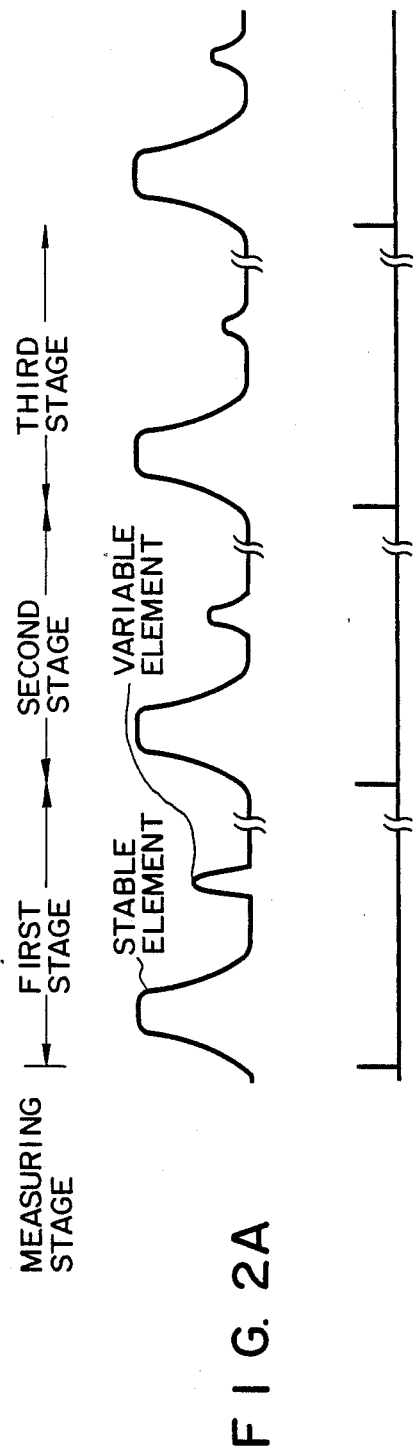
FIG. 2A
FIG. 2B
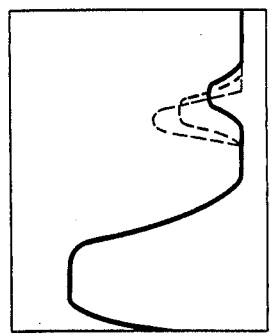
FIG. 5
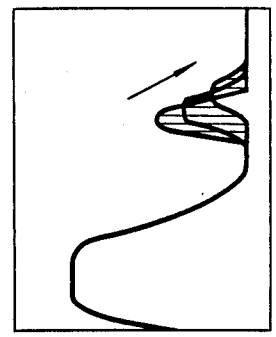
FIG. 3

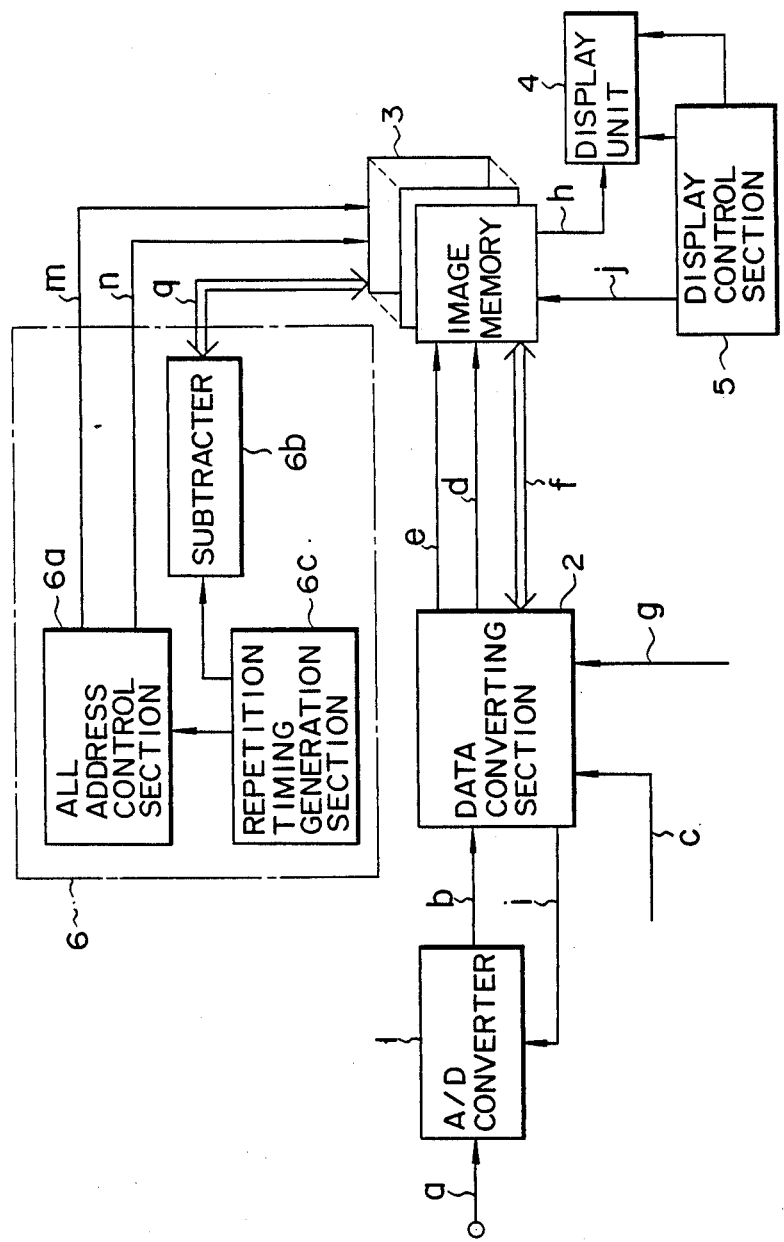
F I G. 4

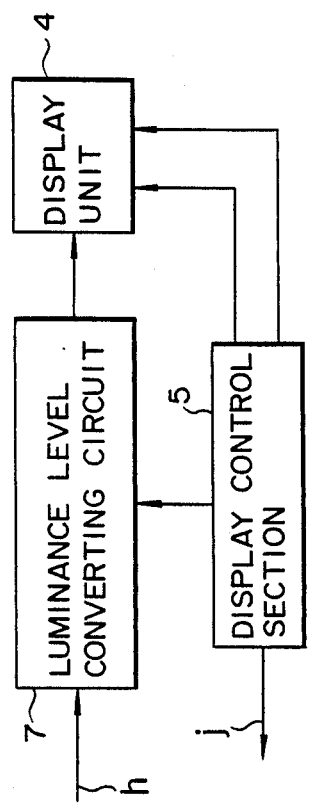
F I G. 6
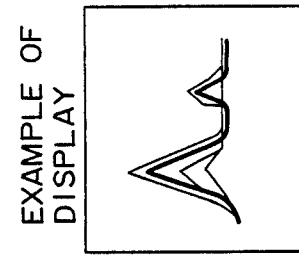
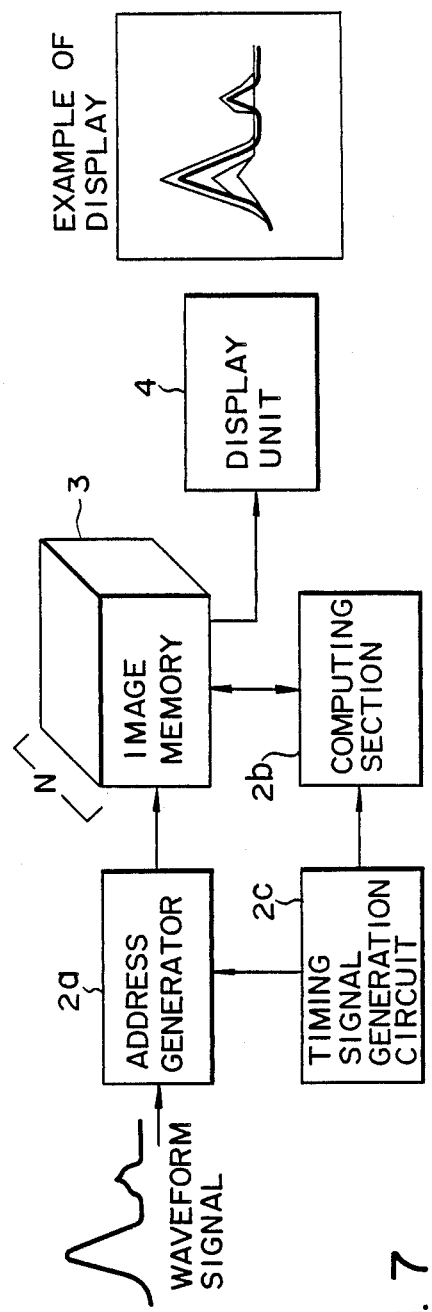
F I G. 7

| LUMINANCE TONE LEVEL | DESIGNATED COLOR | R COLOR SIGNAL LEVEL Dr | G COLOR SIGNAL LEVEL Dg | B COLOR SIGNAL LEVEL Db |
|---|---|---|---|---|
| 1.0 | RED | R10 (=1.0) | G10 (=0.0) | B10 (=0.0) |
| 0.8 | BROWN | R8 | G8 | B8 |
| 0.6 | ORANGE | R6 | G6 | B6 |
| 0.4 | YELLOW | R4 | G4 | B4 |
| 0.2 | GREEN | R2 (=0.0) | G2 (=1.0) | B2 (=0.0) |
| 0.0 | BLUE | R0 (=0.0) | G0 (=0.0) | B0 (=1.0) |

F I G. 11

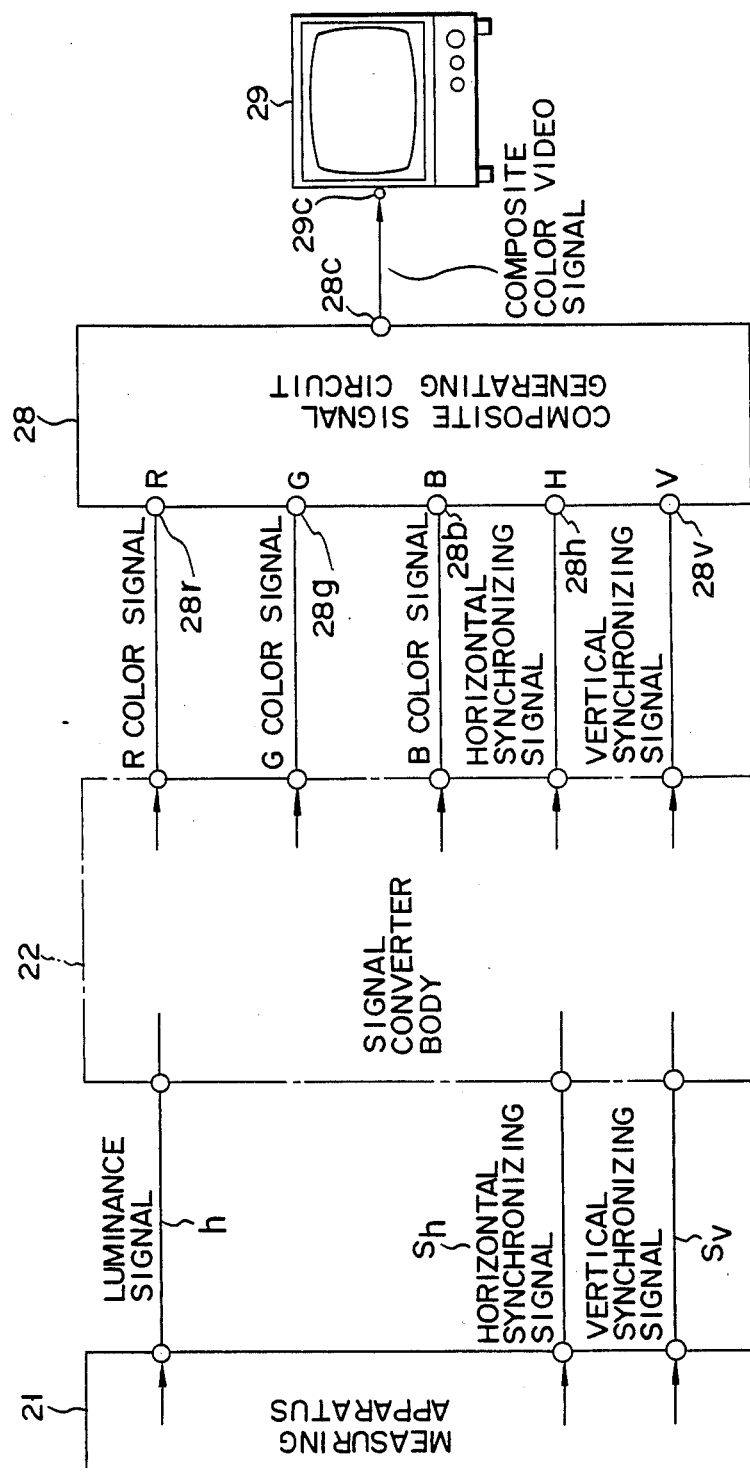
F I G. 12

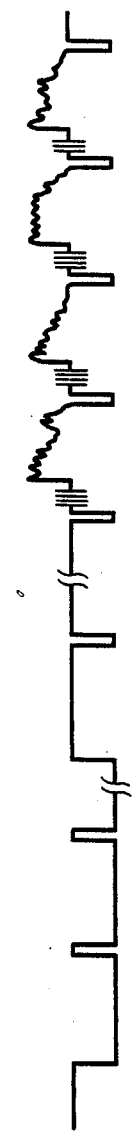
F I G. 13A  F I G. 13B  F I G. 13C  F I G. 13D  F I G. 13E  F I G. 13F  F I G. 13G

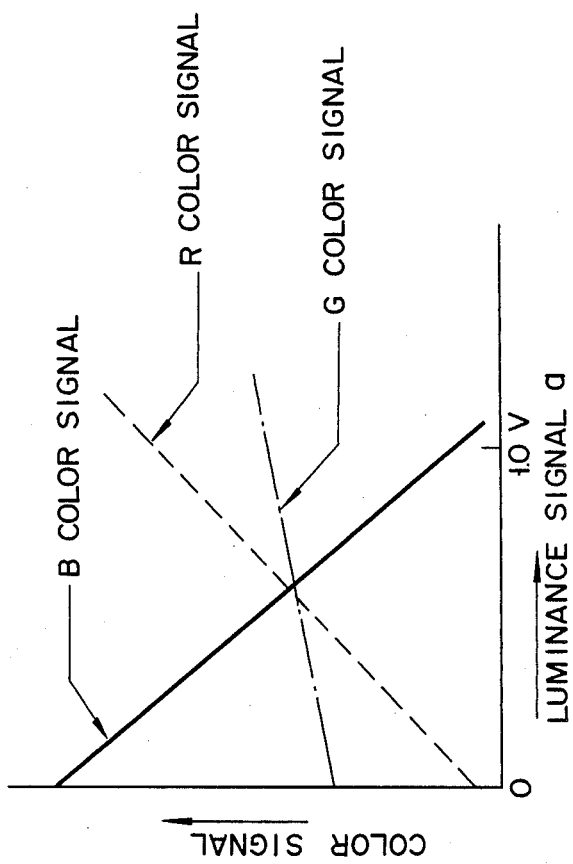
F I G. 15
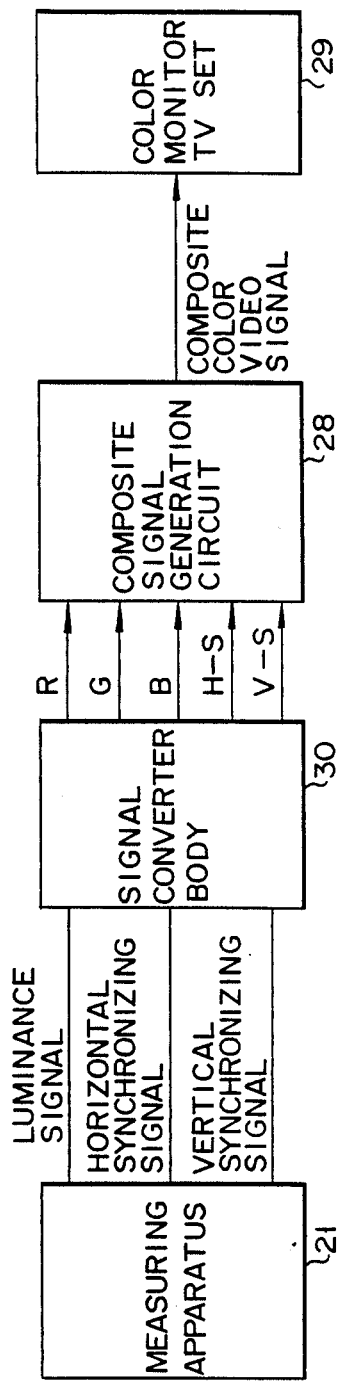
F I G. 16

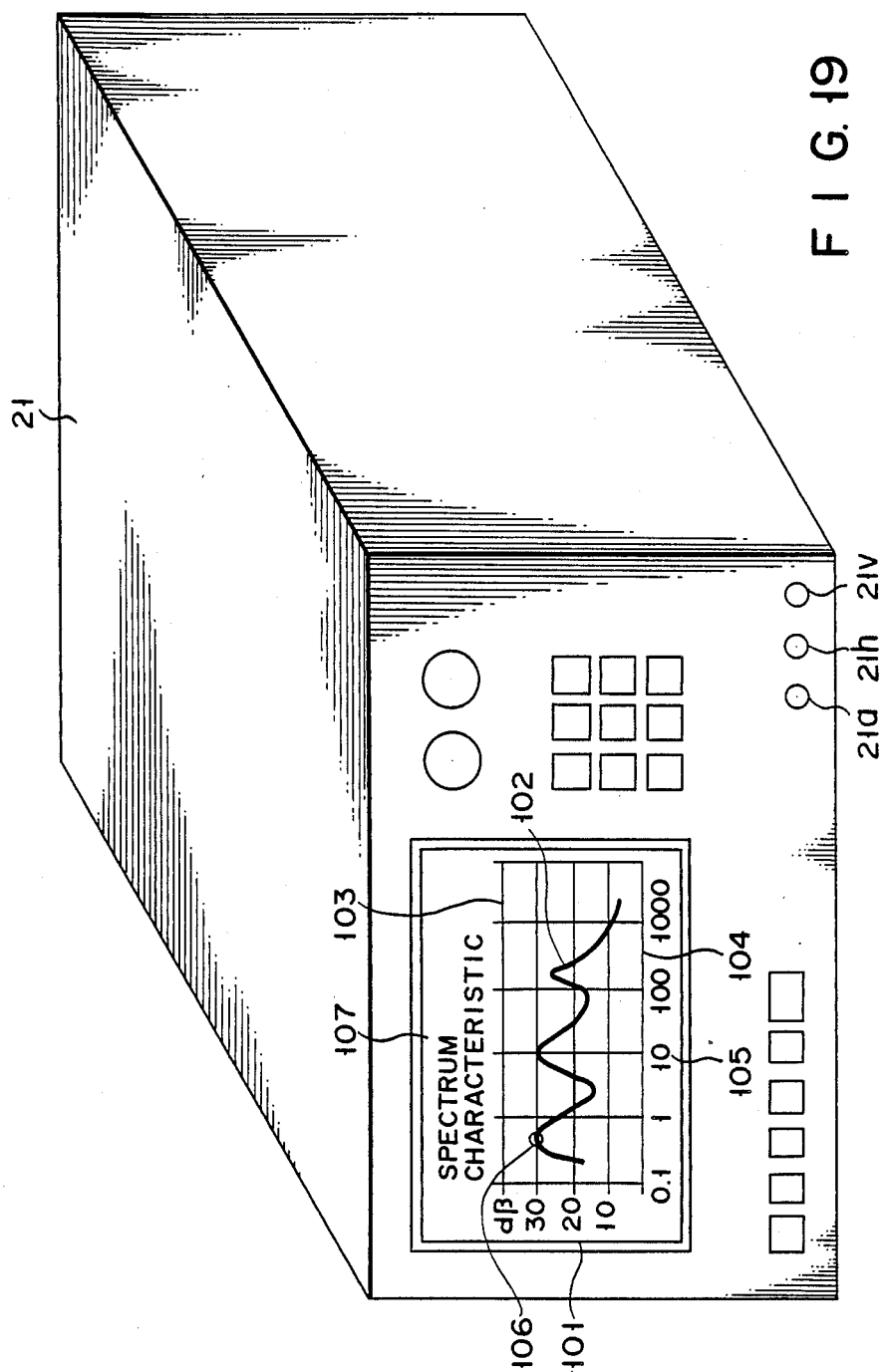

DIGITAL WAVEFORM MEASURING APPARATUS HAVING A SHADING-TONE DISPLAY FUNCTION

Background of the Invention

1. Field of the Invention

The present invention relates to a waveform measuring apparatus responsive to an input signal to observe and measure its waveform and more in particular to a digital waveform measuring apparatus adapted to display an observation waveform, in a shading-tone fashion, with a luminance level corresponding to an input signal magnitude variation level.

2. Description of the Related Art

An analog waveform measuring apparatus, such as an analog oscilloscope, has thus far been employed which is adapted to observe the waveform of an input signal varying with time.

The analog oscilloscope displays a signal waveform with a greater luminance level when the waveform does not vary with time and with a smaller luminance level when the waveform varies with time. It is, therefore, easier to observe a variation of the waveform because the waveform is displayed, in the shading-tone fashion, at a different luminance level corresponding to a varying waveform. In a conventional analog oscilloscope, however, a display waveform can be displayed on an image screen at a limited period of time only because there is a limitation on the sweeping speed as well as on the light to be sustained at the waveform display time.

Recently, a digital storage type oscilloscope has often been employed in view of no time limitation on the sustaining waveform. For example, an-HP 54100A version of a digital oscilloscope (Hewlett-Packard Co.) is disclosed in the publication entitled "Electronic Design" issued on Oct. 18, 1984. This oscilloscope, however, displays a signal waveform in a fine/coarse mode with a fixed luminance level. As will be seen from this example, the digital oscilloscope cannot display the waveform in the shading-tone mode which is a feature of the analog oscilloscope.

A growing demand has been made for a digital oscilloscope which can display a signal waveform in the shading-tone mode, an advantage of the analog oscilloscope.

Even with a digital oscilloscope capable of a shading-tone display, the waveform is hard to observe in view of its associated display unit being relatively small.

Summary of the Invention

A primary object of the present invention is to provide a digital waveform measuring apparatus which can ensure a ready waveform observation by displaying, in a shading-tone mode, a waveform with a luminance level corresponding to an input signal magnitude variation level.

Another object of the present invention is to provide a digital waveform measuring apparatus which can ensure a ready waveform observation by displaying display elements with a color level corresponding to an input signal magnitude variation level.

According to the present invention, there is provided a digital waveform which comprises:

- timing signal generating means for generating a timing signal for each sweep timing dot;
- address generating means for receiving an input signal and the timing signal generated by the timing signal generating means, and for generating an address corresponding to each sweep timing dot and to the magnitude of the input signal, upon each receipt of the timing signal generated by the timing signal generating means;
- memory means for storing data in the address generated by the address generating means;
- computing means for performing a predetermined computation on the data in the memory means each time it receives the timing signal from the timing signal generating means and for outputting a computation result to the memory means, the computation result representing the frequency of the same address generated for each sweep timing dot; and
- display means for receiving the computation result from the memory means and for displaying the input signal with a luminance level corresponding to the computation result output by the computing means.

Brief Description of the Drawings

The foregoing aspects and other features of the present invention will be explained in the following description in connection with the accompanying drawings in which:

FIG. 1 is a circuit diagram showing a digital waveform measuring apparatus according to a first embodiment of the present invention;

FIGS. 2A and 2B are a timing chart of a major signal at each stage of measurement;

FIG. 3 is a view showing an example of a waveform display in the first embodiment;

FIG. 4 is a circuit diagram showing a digital waveform measuring apparatus according to a second embodiment of the present invention;

FIG. 5 is an example of a waveform display in the second embodiment of the present invention;

FIG. 6 is a circuit diagram showing a digital waveform apparatus according to a third embodiment of the present invention;

FIG. 7 is a circuit diagram for explaining an outline of the present invention;

FIG. 11 is a table showing one form of a data converting section in the circuit shown in FIG. 10;

FIG. 12 is a circuit diagram showing a digital waveform measuring apparatus according to a fifth embodiment of the present invention;

FIGS. 13A to 13G show respective signal waveforms of the digital waveform measuring apparatus;

FIG. 15 is a graph showing the amplification characteristic of each amplifier which is used in the sixth embodiment of the present invention;

FIGS. 16, 17A and 17B are circuit diagrams showing digital waveform measuring apparatuses according to seventh to ninth embodiments of the present invention;

FIG. 19 is a perspective view showing an outer appearance of the digital waveform measuring apparatus.

Detailed Description of the Preferred Embodiments

Figure 8:
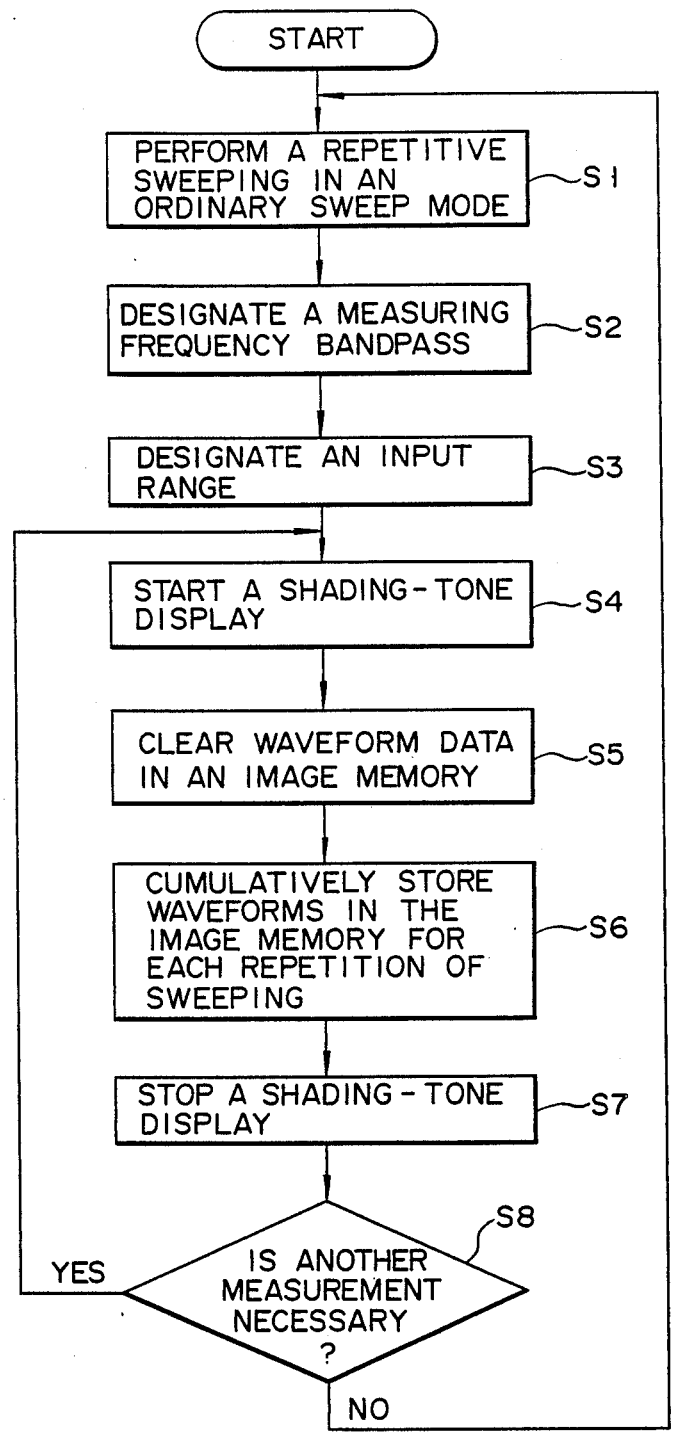
FIG. 8 is a flowchart for explaining the operation of the circuit of FIG. 1.

A digital waveform measuring apparatus according to the present invention will briefly be explained below with reference to FIG. 7.

First, a timing signal generating circuit 2c generates a timing signal for each sweep timing dot. An address generating circuit 2a receives an input signal and the timing signal and, upon each reception of the timing signal from the timing signal generating circuit, generates an address signal corresponding to each sweep timing dot and to the magnitude of the input signal. An image memory 3 stores data in that address. Upon each receipt of the timing signal, a computing section 2b performs a predetermined computation on the data in the image memory 3 and outputs a computation result to the image memory 3. A display section 4 displays the input signal with a luminance level corresponding to the computation result.

The respective embodiments of the present invention will be explained below in more detail with reference to the accompanying drawings.

In FIG. 1, an input signal a at an input terminal 8 is supplied to an A/D converter 1 where it is converted to digital waveform data b. Digital waveform data b is supplied to a data conversion section 2 comprising an address control section 2a, timing generating section 2c and adder 2b.

The timing generating section 2c receives a trigger signal c and supplies a predetermined timing signal to the A/D converter 1, address control section 2a and adder 2b. The address control section 2a receives the digital waveform data b and generates a row address d corresponding to the digital waveform data level. The address control section 2a receives the timing signal i from the timing generating section 2c and generates a column address e corresponding to that timing. The generated row address d and column address e (hereinafter referred to merely as an address) are delivered to the image memory 3.

Instead of the timing signal i described above, a timing signal which is obtained by dividing sweep time for the measurement into desired time intervals is also used as column address e.

The adder 2b reads the luminance level data f from the address of the image memory 3, adds a predetermined value L to the data f and writes a result of addition to the same address. In the aforementioned embodiment, the predetermined value L is 1 and, upon the result of addition reaching 255, a subsequent addition is stopped. The predetermined value L is initially set to the adder 2b. A display control section 5 supplies a control signal j to the image memory 3 and the luminance data f is read, as display data h representative of the result of addition, out of the image memory 3 and supplies it to a D/A converter 4a where the display data h is converted to an analog signal. The analog signal is supplied to a display section 4b. The display section 4b has an image screen of a 512=512 dot matrix array. Of these dots of the dot matrix array, that dot corresponding to the address as set forth above is displayed with a luminance level corresponding to the luminance data f which is stored in the address. The D/A converter 4a and display section 4b constitute a display unit 4.

The address control section 2a and adder 2b are constructed of a hardware system made up of a microcomputer including a CPU, ROM and RAM.

In this embodiment, the image memory 3 can store 8-bit-per-dot luminance data.

FIG. 2A shows a waveform of the input signal a and FIG. 2B shows a waveform of the trigger signal c in FIG. 1. For ease in understanding, it is assumed that the input signal is a pulse comprising of a stable component and a varying element, that the varying component of the pulse sequentially varies from left to right, as shown in FIG. 2A, with a time from a first measuring stage to a third measuring stage, that a plurality of pulses are involved in each measuring stage, and that the trigger signal c is received from outside in synchronism with the pulse as set forth above or generated by comparing a variable threshold level with the aforementioned pulse.

The operation of the circuit (FIG. 1) will be explained below in conjunction with the measuring of the waveform.

At the time of starting a measurement, a start signal g is supplied, for example, from an operation panel, not shown, to the timing generation section 2c. The timing generation section 2c supplies an instruction signal to the address control section 2a and adder 2b so that all luminance data f in the image memory 3 may be cleared.

The measurement is started by the trigger signal c which is input immediately after a start signal g. As shown in FIG. 2B, since the number of repetitive occurrences of the trigger signal c becomes the number of measurements, that is, that repetitive time provides a cycle of measurement. A time period T from the generation of the trigger signal g becomes one measuring cycle. The timing generation section 2c divides the time period T by the number of column address 1 (512 in this case) and generates a timing signal at a divided time interval. The timing signal is delivered to the A/D converter 1, address control section 2a, and adder 2b for control purpose.

On the other hand, upon each receipt of a timing signal i from the timing generation section 2c (512 times for each measuring cycle), the adder 2b adds 1 to the luminance data f corresponding to an address determined by a row address d and column address e and supplies a result of addition to the image memory 3. This means that the luminance data f is weighted according to the frequency or existence of the same address designated for each sweep timing dot. In this case, the luminance level is incremented by 1/256 in view of f=8 bit per dot each time an addition is performed. The maximum luminance level of the dot displayed by the luminance data f becomes 256. As the frequency (trace frequency) with which the dot is traced on the display screen for every measuring cycle is increased, the luminance data f becomes greater and hence the dot appears brighter. If, on the other hand, the trace frequency is decreased, the dot appears darker. More specifically, the level of an input waveform at a particular timing is held by each dot on the display screen for each sweep timing dot. When the frequency of the input waveform of the same level for each sweep timing dot is high, the same dot is swept with a high frequency compared with other dots. Therefore, the dot is displayed with a higher luminance level.

The aforementioned circuit operation will be explained below with reference to a flowchart of FIG. 8.

First, after the digital waveform measuring apparatus has been turned ON, a repetitive sweeping is performed at step 1 in a normal sweeping mode, that is, in an initializing mode at that turned-on time. Then at step 2, the measuring frequency band, that is, the frequency span and center frequency are set. At step 3, the input range, that is, the reference level is set and, at step 4, a shading-tone display is started. At step 5, waveform data which is stored in the image memory 3 is cleared. Each time the sweeping operation is repeated, a waveform is cumulatively stored in the image memory 3. When a proper value is reached while the cumulative result is being monitored, a stop signal is supplied from an operation panel to stop a sweeping operation. At the same time, the shading-tone display is held at step 7. At step 8, it is determined whether or not a measuring operation is again performed. If the answer is in the affirmative, a process following step 4 is implemented. If the answer is in the negative, a process following step 1 is repeated.

An example of a display will be explained below with reference to FIG. 3.

As shown in FIG. 3, the waveform portion corresponding to the stable component of the pulse is displayed with a brighter luminance level because the configuration of the waveform portion is not varied. On the other hand, the waveform portion corresponding to the varying component is distorted in that direction of an arrow in FIG. 3 and displayed with an intermediate tone level. In this embodiment, the waveform remains displayed as it is once it is varied.

The storage of the data in the image memory 3 may be achieved in any proper way if there is a predetermined relation between the dot position on the image screen determined by an address of the image memory 3 and the luminance level.

A digital waveform measuring apparatus according to the second embodiment of the present invention will be explained below by referring to FIG. 4.

The second embodiment is constructed with an addition of a waveform eliminating circuit 6 to the circuit arrangement shown in FIG. 1. As shown in FIG. 4, the waveform eliminating circuit 6 comprises an all address control section 6a, subtracter 6b and repetition timing generation section 6c. As a cycle T1 for eliminating a signal waveform, the repetition timing generation section 6c supplies a timing signal to the address control section 6a and subtracter 6b. The cycle T1 corresponds to the repetition cycle (measuring cycle) T of the timing generation section 2c.

Upon receipt of a timing signal from the repetition timing generation section 6c, the all address control section 6a generates all addresses on the image memory 3, for every cycle T1, which are constructed of combinations of the row addresses n and column address m. The subtracter 6b is adapted to subtract a value M from luminance data stored in all the addresses of the image memory 3 for every cycle T1 and to store a result of subtraction back into the image memory 3, noting that the value M denotes a value satisfying a relation $L/T > M/T1$. The value M is initially set to the subtracter 6b.

The operation of the image memory 3 will be explained below with $T1=2T$, $M=1$ and $L=1$ (L is the same as L in the first the second embodiment). In this case, the operation of the second embodiment is similar to that of the first embodiment except for the operation of the waveform eliminating circuit 6.

For example, if the dot is traced on the display screen for every measuring cycle, that is, the waveform of the input signal a does not vary, the value of the luminance data f is increased by $$(L/T - M/T1 = 1) \times T1 = 2$$

for every measuring cycle of $T1/T = 2$ and the dot is displayed with a greater luminance level. Furthermore, if the dot is traced once for every two measuring cycles, the luminance level of the dot is not varied since the frequency data f is given by $(L/2T - M/T1) \times T1 = 0$. If, on the other hand, the dot is traced with a frequency of below once per two measuring cycles, then the value of the luminance data f is decreased so that the dot is displayed on the display screen in a gradually lowering luminance level.

Generally, when the frequency with which the signal waveform of the same size occurs, this is, the dot is traced, is N times/measuring cycle, then for every measuring cycle the brightness level varies in a ratio of $[L/NT - M/T1] \times T1$.

The present invention will be explained below in more detail with reference to FIG. 5.

Since in FIG. 5 the waveform portion corresponding to the stable component of the pulse is obtained with a greater trace frequency as in the first embodiment, the dot is displayed on the display screen with a maximum luminance level.

In the second embodiment, since the value of the luminance data f is decreased in the case of a smaller trace frequency, a possible waveform representation (the portion as indicated by the dotted line in FIG. 5) after a waveform variation is decreased unlike the first embodiment.

Although the operation of the second embodiment has been explained in a synchronizing relation between T1 and T at $T1 = 2T$, the present invention may be practiced, for example, $T1 = 2.3T$ or may be practiced in an asynchronizing relation between the cycle T1 and the measuring cycle T.

The all address control section 6a and subtraction 6b are constructed of, as in the aforementioned address control section 2a and adder 2b, a microcomputer including a CPU, ROM and RAM. If a synchronizing relation exists between T and T1, the all address control section 6a and subtracter 6b, as well as the address control section 2a and adder 2b, can be constituted by the same microcomputer. Furthermore, the repetition timing generation section 6c can be comprised of the timing generation section 2c.

The timing relation between the operation of the waveform eliminating circuit 6 and that of the data conversion section 2 is the same as the timing relation between the operation of the waveform eliminating circuit 6 and the display operation of a display unit 4 made by reading the luminance data f, by a display control section 5, out of an image memory 3. That is, the display control section 5 controls the display section 5 so that the display operation is effected for every repetition frequency T2. On the other hand, the waveform eliminating circuit 6 is of such a type that, in order to eliminate a signal waveform for every cycle T1, it subtracts M from the luminance data of all addresses of the image memory and stores a result of subtraction back into the address of the image memory 3. In this case, either a synchronous or an asynchronous timing may be taken between the repetition cycle T2 and the cycle T1.

A third embodiment of the present invention will be explained below with reference to FIG. 6. This embodiment is similar in arrangement and operation to the previous two embodiments as viewed up to a time at which display data h is input.

In the circuit arrangement shown in FIG. 6, a luminance conversion circuit 7 includes a ROM table and allows an address of the ROM table to be designated upon receipt of display data h so that it is converted to corresponding luminance data. In the third embodiment, the display data h is weighted by luminance data to obtain a linearity and hence to provide an easier-to-observe luminance level.

As already set forth above, the digital waveform measuring apparatus of the present invention performs a digital waveform display by converting the luminance level in accordance with an input signal variation level. It is, thus, possible to observe the signal waveform corresponding to the trace frequency which could not otherwise been implemented in a conversional digital storage oscilloscope. Furthermore, a limitation on the data holding time which is short in the analog storage oscilloscope can substantially been eliminated.

As the luminance data of the image memory can be varied in accordance with the trace frequency, it is possible to readily observe a varying signal waveform. It is also possible to readily and visually observe the signal waveform because the display data is weighted by the luminance conversion circuit.

Figure 9:
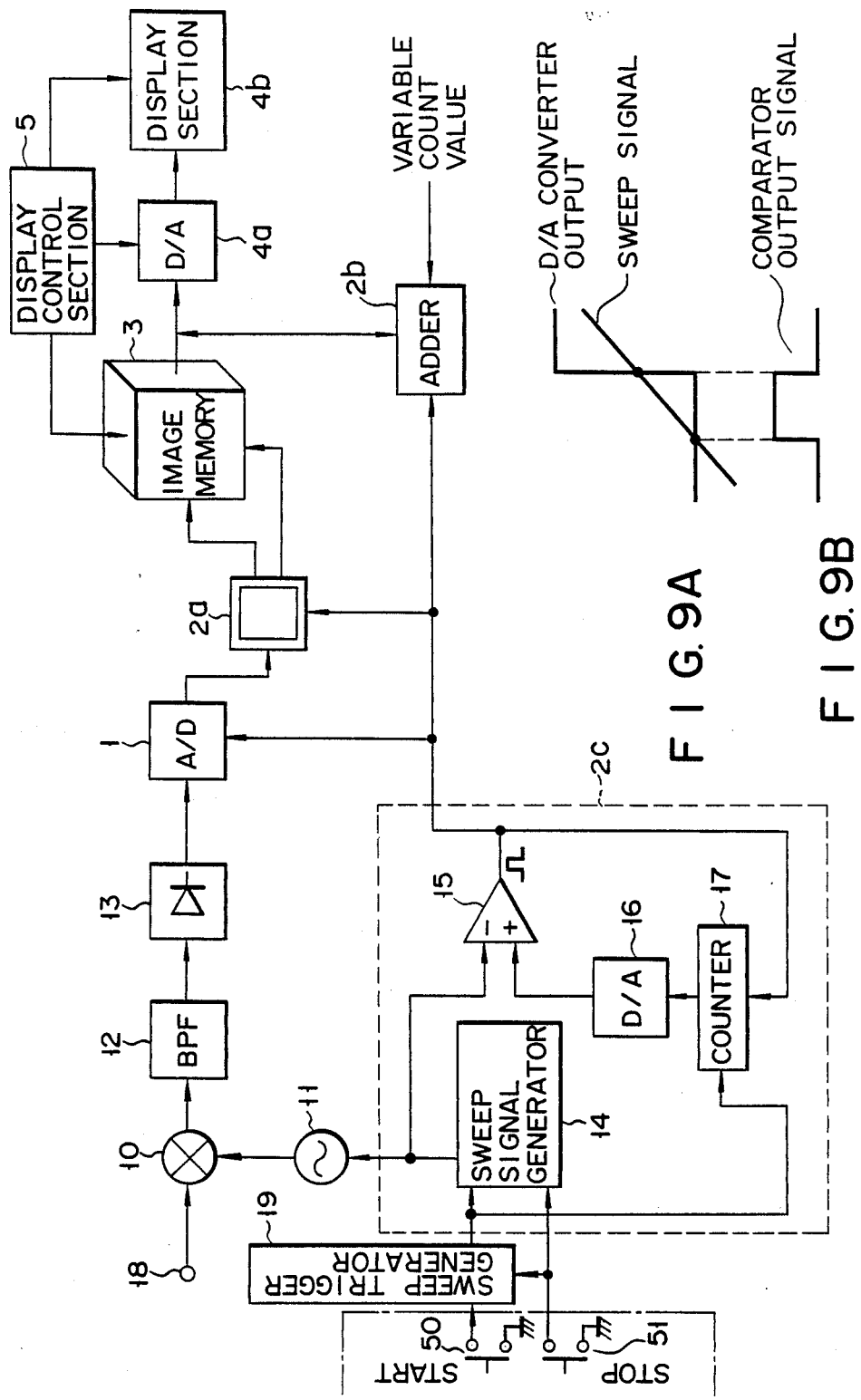
FIG. 9A is a circuit diagram showing a digital waveform measuring apparatus of the present invention as applied to a spectrum analyzer.
FIG. 9B shows the input/output relationship of a comparator shown in FIG. 9A.

FIG. 9A is a view showing the present digital waveform measuring apparatus which is applied to a spectrum analyzer.

The operation of a spectrum analyzer as shown in FIG. 9A will be explained below.

An input signal (a signal to be measured) on an input terminal 18 is mixed with a local oscillation signal (local signal) coming from a local oscillator 11 to obtain an intermediate frequency signal. The local oscillation signal of the local oscillator 11 varies in accordance with the level of a sweeping signal from a sweeping signal generator 14. The intermediate frequency signal is supplied to a bandpass filter 12 to extract a frequency component corresponding to a passed frequency. Then a signal which is output from the bandpass filter 12 is detected by a detector 13 which in turn generates a DC detection signal corresponding to the output signal level. The detection signal is supplied to the aforementioned A/D converter 1 where it is processed in the same way as set forth above in the first embodiment. The processed signal is displayed as the detection waveform on a display section 4b.

How the aforementioned column e is produced through a timing generation section 2c will be explained in association with the sweep signal generator 14. First, a sweep trigger generator 19 is driven by a start signal which is generated by depressing a start switch 50. The sweep trigger generator 19 generates a trigger signal repetitively at a given cycle and supplies it to the sweep signal generator 14. A sweep signal which is output from the sweep signal generator 14 is supplied to one input terminal of a comparator 15. The comparator 15 compares the sweep signal and a signal input to the other input terminal of the comparator 15, and outputs a comparator output signal. When the level of the sweep signal exceeds that of the signal input to the other terminal, the comparator output signal rises, as shown in FIG. 9B. The rise of the output signal is supplied to the address control section 2a and counter 17. The counter 17 is reset by the start signal and adapted to count the rises of received comparator output signals and to deliver a count value to a D/A converter 16. The D/A converter 16 converts the count value to an analog signal. The analog signal output from the D/A converter 16 reflects the variation (increase) in the count value from the counter 17, and therefore the level of the analog signal is made greater by a given voltage range compared with the signal level generated at the time of the rise in the comparator output signal. The analog signal is supplied to the other input terminal. The comparator 15 compares the sweep signal which is supplied to one input terminal with a signal which is supplied from the D/A converter 16 to the other input terminal thereof, and detects that the level of the signal from the D/A converter 16 exceeds the sweep signal level, with the result that the comparator output signal falls (FIG. 9B). After this, the above operation is repeated every time the sweep signal level exceeds the output signal level of the D/A converter 16.

The sweeping operation can be stopped by inputting a stop signal, which is generated by depressing a stop switch 51, to the sweep trigger generator 19 and sweep signal generator 14.

A digital waveform measuring apparatus according to a fourth embodiment of the present invention will be explained below with respect to FIG. 10.

The aforementioned digital waveform measuring apparatus includes, as shown in FIG. 19, a display section for displaying a result of measurement. Such a display section is hard to observe in view of being relatively small in dimension. For this reason, it is sometimes necessary to display the waveform characteristic in enlarged format by a monitor TV which is mounted on the outside of the measuring apparatus. The measuring apparatus has signal output terminals 21a, 21h and 21v for supplying signals to a monitor TV set. In this case, the output terminal 21a outputs display data h shown in FIG. 1 as a luminance signal and the output terminals 21h and 21v, respectively, output a horizontal and a vertical synchronizing signal ($S_h$ and $S_v$) from the display control section 5.

How display elements are color-displayed by an externally-mounted color monitor TV set when a monochrome video signal is supplied from the present digital waveform measuring apparatus will be explained below.

In the present embodiment, it is assumed that the digital luminance signal which is supplied as the display data from the image memory 3 in FIG. 1 has, for example, a six-step tone luminance level. If, for example, a voltage level Va of the input signal varies within a range from 0.0 to 1.0, it can be seen that, as shown in FIG. 11, (1) a luminance tone level Va where $0.0 \, Va < 0.1$ is 0.0 (blue);

(2) a luminance tone level Va where $0.1 \leq Va < 0.3$ is 0.2 (green);

(3) a luminance tone level Va where $0.3 \leq Va < 0.5$ is 0.4 (yellow);

(4) a luminance tone level Va where $0.5 \leq Va < 0.7$ is 0.6 (orange);

(5) a luminance tone level Va where $0.7 \leq Va < 0.9$ is 0.8 (brown); and (6) a luminance tone level Va where $0.9 \leq Va < 1.0$ is 1.0 (red).

Figure 10:
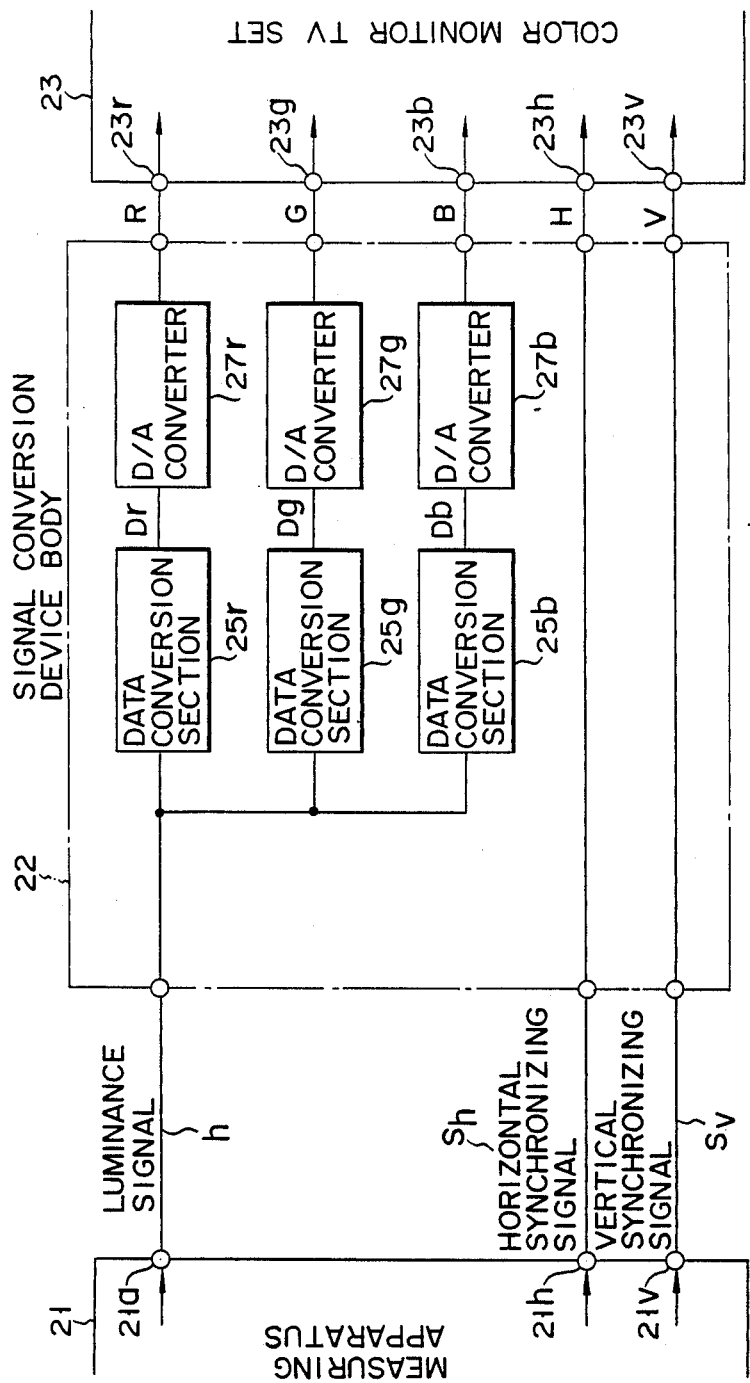
FIG. 10 is a circuit diagram showing a digital waveform measuring apparatus according to a fourth embodiment of the present invention.

As shown in FIG. 10, the display data h coming from the image memory 3, that is, the digital luminance signal is supplied via the output terminal 21a to data conversion sections 25r, 25g and 25b in a signal conversion device body 22. These data conversion sections are composed of, for example, a ROM where color signal levels Dr, Dg and Db of an R (red), G (green) and B (blue) are determined in accordance with the input luminance tone levels. For example, if the luminance tone level is 1.0, a corresponding specific color is red in which case Dr=1.0 and Dg=Db=0.0. The color signal levels Dr, Dg and Db are output to D/A converters 27r, 27g and 27b, respectively, where color signal levels Dr, Dg and Db are converted to R, G and B color signals. These R, G and B color signals are output to the input terminals 23r, 23g and 23b of a color monitor TV set 23. In this case, the horizontal synchronizing signal $S_h$ and vertical synchronizing signal $S_v$ are output directly to the input terminals 23h and 23v, respectively, without passing through the data conversion sections 25r, 25g and 23v.

In this way, the R, G and B color signals and a color image signal composed of the horizontal synchronizing signal $S_h$ and vertical synchronizing $S_v$ can be displayed on the color monitor TV23.

According to the fourth embodiment described above, different colors are used for displaying input signal magnitude variations, instead of the waveform display in a shading-tone fashion, as shown in the first to third embodiments. Therefore, input signal magnitude variations can be displayed more clearly.

Another aspect of the fourth embodiment will be explained below.

FIG. 19 is a perspective view showing an outer appearance of the digital waveform measuring apparatus. The display elements, such as the waveform characteristic 102, scale 103, coordinate axes 104, graduation 105, marker 106 and characteristic names 107, are displayed on the display section.

Let it be assumed that these display elements are displayed with the mutually different luminance levels. For example, the waveform characteristic 102 and marker 106 are displayed with a high luminance level and the scale 103 and so on are displayed with a low luminance level. In this case, if a greater luminance tone level, for example, a red color (1.0) is selected for the waveform characteristic 102 and marker 106, then a combination of R, G and B color signals which are output from the D/A converters 27r, 27g and 27b appears red on the image screen as will be seen in FIG. 11. As, for example, the scale is displayed with the low luminance level, the low luminance tone level, for example, a green color (0.2) is selected in the table of FIG. 11 in which case the combination of R, G and B color signals which are output from the D/A converters 27r, 27g and 27b appears green on the display screen. As a result, the scale 3 is displayed in green color on the display screen of the color TV set 23.

The measuring data which is displayed in a varying luminance tone level on the monochrome CRT display screen is displayed on the color monitor TV23 in a different color corresponding to the respective luminance tone level. By doing so, a readily reviewable screen is obtained on the color monitor TV set 23.

FIG. 12 is a block diagram showing a monochrome/color signal conversion apparatus which is employed for a digital waveform measuring apparatus according to a fifth embodiment of the present invention. In this embodiment, a color monitor TV set 29 is used, having only a composite color signal input terminal 29c for inputting an NTSC type composite color video signal and not having any R, G and B color signals for the color monitor TV set.

That is, the measuring apparatus 21 delivers a luminance signal and monochrome video signal comprised of a horizontal synchronizing signal h and vertical synchronizing signal v to a signal conversion device body 22 of the same type as shown in FIG. 1. The luminance signal a is converted to R, G and B color signals at the signal conversion device body 22. The R, G and B color signals and horizontal synchronizing signal h and vertical synchronizing v in the color image signal are input to the corresponding signal input terminals 28r, 28g, 28b, 28h and 28v of a composite signal generator 28.

The composite signal generator 28 is of a conventional type which is employed for transmitting, as an electromagnetic wave, the R, G and B color signals obtained by a color camera at the location of a broadcasting station. The respective signal waveforms which are input to the composite signal generator 28 are as shown in FIGS. 13A to 13F. That is, the luminance signal waveform is shown in FIG. 13A and the R, G and B color signals and horizontal synchronizing signal h and vertical synchronizing signal v are shown in FIGS. 13B, 13C, 13D, 13E and 13F, respectively. The composite color video signal having a waveform as shown in FIG. 13G is supplied via an output terminal 28c to a composite color signal input terminal 29c of a color monitor TV set 29.

The color monitor TV set 29 displays a color image in a color-separation representation corresponding to the luminance tone level of the luminance signal a which is output from the measuring apparatus 21. It is, therefore, possible to obtain substantially the same effect as that of the previous embodiments.

Figure 14:
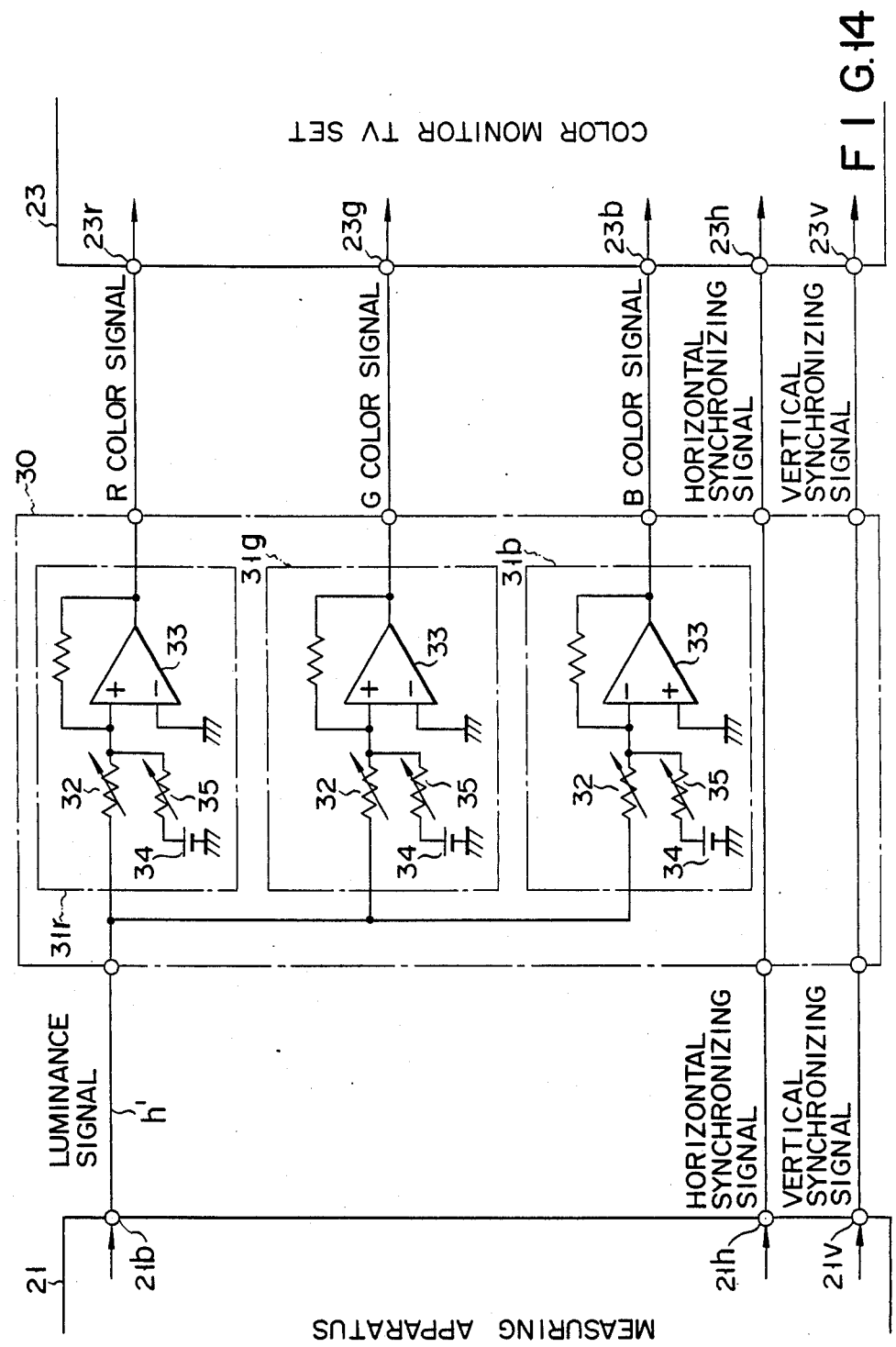
FIG. 14 is a circuit diagram showing a digital waveform measuring apparatus according to a sixth embodiment of the present invention.

FIG. 14 is a circuit diagram showing a monochrome/color signal conversion device which is employed in a digital waveform measuring apparatus according to a sixth embodiment of the present invention. The same reference numerals are employed in the arrangement shown in FIG. 14 to designate parts or components corresponding to those shown in FIG. 10.

In this embodiment, the luminance signal h' output from the measuring apparatus 21 corresponds to the output signal from the D/A converter 4a. This signal h' is output from the output terminal 21h as an analog luminance signal, and input to a signal conversion device body 30 shown in FIG. 14. The signal conversion device body 30 is composed of three amplifiers 31r, 31g and 31b. A luminance signal a which is output from the measuring apparatus 21 is supplied to respective amplifiers 31r, 31g and 31b. The output signal of the amplifier 31r is input as an R color signal to an R color signal input terminal 23r in a color monitor TV set 23. The output signal of the amplifier 31g is input as a G color signal to a G color signal input terminal 23g in the color monitor TV set 23. The output signal of the amplifier 31b is input as a B color signal to a B color signal input terminal 23b in the color monitor TV set 23.

In the respective amplifiers 31r, 31g and 31b, the input luminance signal a is input to a positive-side (+) input terminal of a corresponding operational amplifier 33 through an input resistor 32 for determining an amplification factor. An offset voltage is applied from a constant voltage source 34 through a variable resistor 35 to the positive-side (+) input terminal of the operational amplifier 33. The negative-side (−) input terminal of the amplifier 33 is grounded.

In the amplifier 31b corresponding to the B color signal, the luminance signal a is input to a negative-side (−) input terminal of the operational amplifier 33 and a positive-side (+) input terminal of the operational amplifier 33 is grounded.

The respective amplification factor and respective offset voltage level of the amplifiers 31r, 31g and 31b can be set to any arbitrary values by variably controlling the respective input resistor 32 and respective variable resistor 35. By so setting the respective amplification factor and offset voltage level, it is possible to obtain such an input signal (luminance signal)-to-output signal (respective color signal) characteristic as shown, for example, in FIG. 15.

Judging from the characteristic as shown in FIG. 15, the B color signal percentage goes high for a low luminance tone signal of, for example, the scale 3, that is, for the display element of a low luminance tone level and a corresponding area appears substantially green on the display screen of the color monitor TV set 23. On the other hand, the R color signal percentage goes high for a high luminance tone signal level of, for example, the waveform characteristic 2, that is, for the display element of a high luminance tone level and a corresponding area appears substantially red on the display screen of the color monitor screen.

Since the respective R, G and B color signals vary in their constituent ratio in accordance with the level of the luminance signal a, a corresponding display color varies in accordance with the level of the luminance signal. It is, thus, possible to obtain substantially the same effect as in the previous embodiments of the present invention.

Furthermore, the amplifiers alone are employed in the embodiment of the present invention, making the circuit size compact and hence reducing the manufacturing cost.

FIG. 16 is a block diagram showing a monochrome/color signal conversion device which is employed in a digital waveform measuring apparatus according to a seventh embodiment of the present invention. The same reference numerals are employed in FIG. 16 to designate parts or elements corresponding to those shown in FIG. 14.

In this embodiment, respective R, G and B color signals supplied from three amplifiers 31r, 31g and 31b in a signal conversion device body 30, as well as a horizontal synchronizing signal (H-S) and vertical synchronizing signal (V-S), are supplied to a composite signal generating circuit 28 of the same type as shown in FIG. 12. These signals are connected by a composite signal generating circuit 28 into a composite color video signal. The composite color video signal is fed to a composite color signal input terminal of a color monitor TV set 29.

Even in this embodiment, since a monochrome video signal which is output from the measuring apparatus 21 can be displayed on the screen of the color monitor TV set 29 in a separate color representation, it is possible to obtain substantially the same result as in the previous embodiment.

The present invention is not restricted to the aforementioned respective embodiments.

Figure 17A:
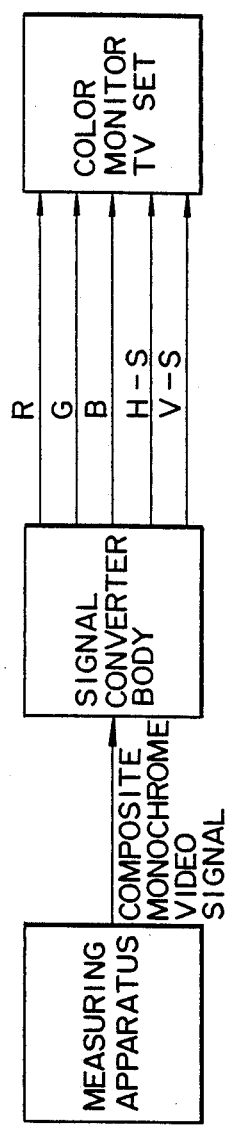
Figure 17B:
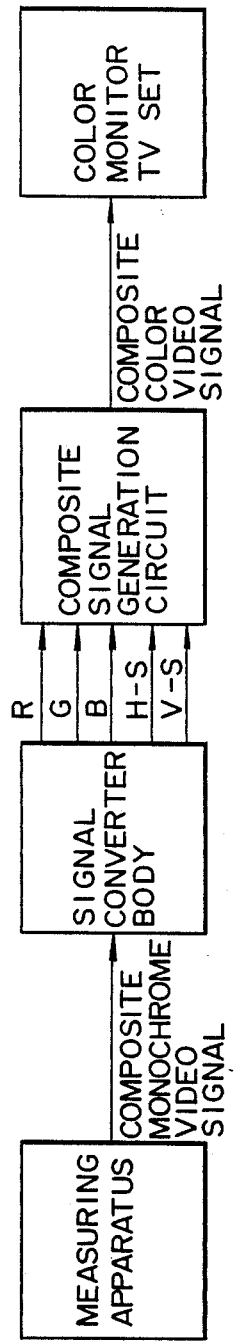
Figure 18:
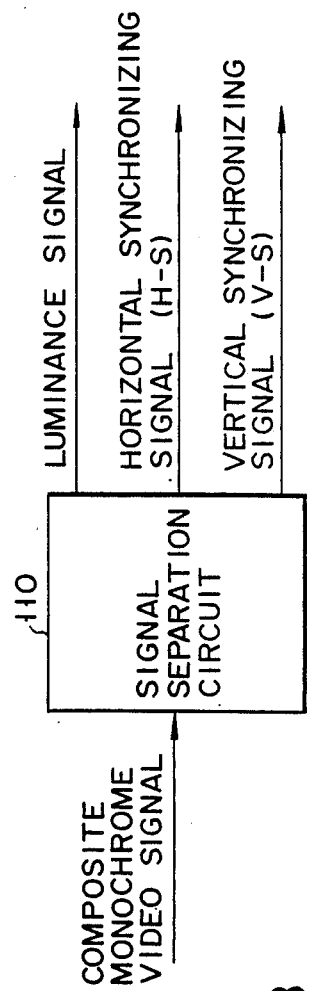
FIG. 18 is a view showing a signal separation circuit as employed in the embodiments shown in FIGS. 17A and 17B.

Although, in the aforementioned embodiment, the luminance signal a and horizontal and vertical signals have been explained as being separately output from the measuring apparatus 21, it is possible that, if a composite monochrome video signal alone is output from the measuring apparatus as shown in FIGS. 17A and 17B, a signal separation circuit 110 for separating the composite monochrome video signal into the luminance signal and horizontal and vertical synchronizing signals, may be incorporated into the signal conversion device body as shown in FIG. 18 to feed respective color signals to the corresponding color signal input terminals of a color monitor TV set or to feed a composite color video signal to a composite color signal input terminal of a color monitor TV set via a composite signal generating circuit as shown in FIG. 17B.

As set forth above, according to the fourth to ninth embodiments of the present invention, it is possible to display a plurality of display elements, including waveform characteristic, on the screen of the color monitor TV set in a separate color representation by allocating a designated color to respective luminance tone level of the luminance signal in a monochrome video signal which comes from the measuring apparatus. It is thus possible to provide an easier-to-observe display screen at a low cost.

Furthermore, the luminance signal can be displayed in a different color corresponding to the level of the luminance signal with the use of three amplifiers having a different amplification factor or a different offset voltage. By doing so, an easier-to-observe display screen can be offered at a low cost.

What is claimed is:

1. A digital waveform measuring apparatus comprising;
    address generating means for generating an address corresponding to a magnitude of an input signal for each of a number of sweep timing dots;
    frame buffer memory means for storing data corresponding to each timing dot and to the address generated by the address generating means, the data representing the existence of a waveform to be observed;
    weight computing means for, upon the occurrence of a coincidence between an address generated by the address generating means with a given sweep timing dot and an address generated by the address generating means with the next sweep timing dot, weighting the data stored in the address which is generated with the given sweep timing dot and for outputting the weighted data to the frame buffer memory;
    said weight computing means further including means for outputting color data corresponding to the number of occurrences of the same address generated for each sweep timing dot; and
    display means for receiving the weighted data from the frame buffer memory and for displaying it as a waveform.

2. A digital waveform measuring apparatus comprising:
    timing signal generating means for generating a timing signal for each of a number of sweep timing dots;
    address generating means for receiving an input signal and the timing signal generated by the timing signal generating means, and for generating an address corresponding to each sweep timing dot and to the magnitude of the input signal, upon each receipt of the timing signal generated by the timing signal generating means;

memory means for storing data in the address generated by the address generating means;

computing means for performing a predetermined computation on the data in the memory means each time it receives the timing signal from the timing signal generating means and for outputting a computation result to the memory means, the computation result representing the frequency of the same address generated for each sweep timing dot; and display means for receiving the computation result from the memory means and for displaying the input signal with a luminance level corresponding to the computation result output by the computing means.

3. The digital waveform measuring apparatus according to claim 2, wherein said timing signal generating means comprises sweep signal generating means, a counter, a digital/analog converter for converting a count value which is output from the counter to an analog signal; and a comparator for comparing an output which is produced from the digital/analog converter with an output which is generated from the sweep signal generating means and for outputting a predetermined timing signal.

4. The digital waveform measuring apparatus according to claim 3, further comprising means for supplying a stop signal to said sweep signal generating means so as to stop a sweeping operation of said sweep signal generating means.

5. The digital waveform measuring apparatus according to claim 3, further comprising means for supplying a start signal for driving said sweep signal generating means, wherein said start signal is used for resetting the counter.

6. The digital waveform measuring apparatus according to claim 2, wherein said address includes a row address corresponding to the magnitude of said input signal and a column address corresponding to each sweep timing dot.

7. The digital, waveform measuring apparatus according to claim 2, wherein said computing means includes adding means for adding a predetermined value to that data which is read out of the address of said memory means and for writing a result of addition to said address.

8. The digital waveform measuring apparatus according to claim 7, wherein said predetermined value is 1.

9. The digital waveform measuring apparatus according to claim 2, further comprising subtracting means for subtracting a predetermined value from that data which is read out of the address of said memory means and for writing a result of subtraction to that address.

10. The digital waveform measuring apparatus according to claim 9, further comprising repetition timing generating means for giving a timing with which a subtraction is carried out by said subtracting means.

11. The digital waveform measuring apparatus according to claim 10, further comprising all address generating means for receiving a timing signal from said repetition timing generating means and for generating all addresses of said memory means.

12. The digital waveform measuring apparatus according to claim 2, further comprising luminance converting means for receiving an output from said memory means and for converting it into predetermined luminance data.

13. The digital waveform measuring apparatus according to claim 12, wherein said luminance converting means is composed of a ROM.

14. The digital waveform measuring apparatus according to claim 7, wherein said predetermined value is variable.

15. The digital waveform measuring apparatus according to claim 2, further comprising converting means for receiving said computation result which is output from said computing means and for outputting a corresponding plurality of color signals, and displaying means for displaying said input signal in color mode in accordance with said plurality of color signals output from said converting means.

16. The digital waveform measuring apparatus according to claim 15, wherein said converting means is composed of a ROM.

17. The digital waveform measuring apparatus according to claim 2, further comprising converting means for receiving said computation result which is output from said computing means and for outputting a corresponding plurality of color signals, means for receiving said plurality of color signals which are output from said converting means and for generating a composite signal, and means for displaying said composite signal in a color mode.

18. The digital waveform measuring apparatus according to claim 15, wherein said converting means includes a plurality of amplifiers each having a different amplification factor.

19. The digital waveform measuring apparatus according to claim 17, wherein said converting means includes a plurality of amplifiers each having a different amplification factor.

20. The digital waveform measuring apparatus according to claim 2, further comprising means for receiving the computation result as a composite video signal and for separating a luminance signal and horizontal and vertical synchronizing signals from said composite video signal, means for receiving said luminance signal which is separated by the separating means and for outputting a plurality of color signals, and displaying means for displaying the input signal in accordance with said plurality of color signals which are output from said converting means.

21. The digital waveform measuring apparatus according to claim 2, further comprising means for receiving the computation result as a composite video signal and for separating it into a luminance signal and horizontal and vertical synchronizing signals, converting means for receiving said luminance signal thus separated and for outputting a corresponding plurality of color signals, means for receiving said plurality of color signals which are output from said converting means and for generating a composite signal, and means for displaying said composite signal generated by said generating means in color mode.

22. A digital waveform measuring apparatus comprising:

converting means for receiving and frequency-converting an input signal;

detecting means for frequency-discriminating the input signal frequency-converted by the converting means and for outputting a detection signal;

timing signal generating means for generating a timing signal for each of a number of sweep timing dots;

address generating means for receiving the timing signal generated by the timing signal generating means and the detection signal detected by said detecting means and for generating an address corresponding to each sweep timing dot and to the magnitude of said detection signal, upon each receipt of said timing signal generated by said timing signal generating means;

memory means for storing data in the address generated by the address generating means;

computing means for performing a predetermined computation on the data stored in said memory means, each time it receives said timing signal from said timing signal generating means, and for outputting a computation result to the memory means, the computation result representing the frequency of the same address generated for each sweep timing dot; and display means for receiving the computation result from the memory means and for displaying said input signal with a luminance level corresponding to said computation result output by the computing means, computation coming from said computing means.

23. The digital waveform measuring apparatus according to claim 22, wherein said address includes a row address corresponding to the magnitude of said detection signal and a column address corresponding to eacn sweep timing dot.

24. The digital waveform measuring apparatus according to claim 22, wherein said computing means includes adding means for adding a predetermined value to said data which is read out of said address stored in said memory means and for writing a result of addition into said address of said memory means.

25. The digital waveform measuring apparatus according to claim 24, wherein said predetermined value is 1.

26. The digital waveform measuring apparatus according to claim 22, further comprising subtracting means for subtracting a predetermined value from that data which is read out of said address of said memory means and for writing a subtraction result into said address of said memory means.

27. The digital waveform measuring apparatus according to claim 22, further comprising luminance converting means for receiving an output from said memory means and for converting it into predetermined luminance data.

28. The digital waveform measuring apparatus according to claim 27, wherein said luminance converting means is comprised of a ROM.

29. The digital waveform measuring apparatus according to claim 22, further comprising means for receiving said computation result from said computing means and converting it to corresponding color signals.

* * * * *